United States Patent [15] 3,676,789

Bray [45] July 11, 1972

[54] LOW DISTORTION AGC AMPLIFIER

[72] Inventor: Derek Bray, Fuchstanzstrasse 12, Stierstadt/Taunus, Germany

[22] Filed: Nov. 16, 1970

[21] Appl. No.: 89,994

Related U.S. Application Data

[63] Continuation-in-part of Ser. No. 827,749, May 26, 1969, abandoned.

[52] U.S. Cl. ..............................330/29, 330/30 D, 330/134

[51] Int. Cl. ..........................................................H03g 3/30

[58] Field of Search .............330/293 OR, 30 D, 38 R, 38 M, 330/69, 134

[56] References Cited

UNITED STATES PATENTS 3,440,554 4/1969 McGraw et al. .....................330/30 D 3,444,472 5/1969 Johnson ..........................330/30 D X

*Primary Examiner*—Roy Lake

*Assistant Examiner*—James B. Mullins

*Attorney*—Roger S. Borovoy and Alan H. MacPherson

[57] ABSTRACT

A linear amplifier in an automatic gain control circuit whose gain is a function of the ratio of two bias currents is obtained by selectively coupling two pairs of semiconductor devices such that the effects of nonlinearities due to the logarithmic relationship between voltage and current across a PN junction cancel. The relationship between the two pairs of devices is such that the output signal from the second pair of devices is linearly related to the input signal driving the first pair of devices.

10 Claims, 4 Drawing Figures

INVENTOR.
DEREK BRAY
BY Alan H. MacPherson

ATTORNEYS

INVENTOR.
DEREK BRAY
BY Alan H. MacPherson
ATTORNEYS

INVENTOR.
DEREK BRAY
BY Alan H. MacPherson
ATTORNEYS

LOW DISTORTION AGC AMPLIFIER

CROSS-REFERENCE TO RELATED APPLICATION

This is a continuation-in-part of application Ser. No. 827,749 filed May 26, 1969, now abandoned.

BACKGROUND OF THE INVENTION

1. Field of the Invention

This invention relates to automatic gain control amplifiers and in particular, to an automatic gain control amplifier, capable of being produced as an integrated circuit, which has low distortion and a gain which is independent of the non-linearities of the circuit elements.

2. Brief Description of the Prior Art

Automatic gain control amplifiers using solid state components such as diodes and transistors are well known. However, such amplifiers typically have either poor linearity, poor signal handling capabilities, restricted frequency range, high noise, great temperature sensitivity, large power dissipation, poor inter-modulation performance, or restricted automatic gain control range. Circuits which overcome one or more of those limitations are known. However, no circuit is known which substantially overcomes all these limitations.

SUMMARY OF THE INVENTION

This invention on the other hand, provides an automatic gain control circuit which substantially overcomes all of the above limitations. The circuit of this invention relies on the inherent logarithmic characteristics of semiconductor devices, such as diodes and transistors, to cancel out the effect of these nonlinear characteristics on signals processed by these devices. The gain of this circuit is dependent primarily on the ratio of two currents provided by current bias sources. Thus, the gain is substantially independent of temperature, provided the bias current ratio remains constant with temperature changes. When operated within the signal handling capabilities of the circuit, the output signal is undistorted and intermodulation is minimized.

According to this invention, an automatic gain control circuit contains two coupled pairs of active devices, each pair typically consisting of either transistors or diodes. An input signal passes through a differential amplifier to drive the first pair of devices and the output signal is taken from the second pair of devices. Two current sources bias the two coupled pairs of devices. The transconductance of the combined two pairs of devices and the differential amplifier is primarily a function of the ratio of the currents from the two current sources. By selectively varying the ratio of the currents from the two current sources, the amplitude of the output signal from the second pair of devices is held constant despite variations in the amplitude of the input signal to the differential amplifier.

As a feature of this invention, the nonlinear characteristics of the first pair of active devices are compensated for by coupling the second pair of active devices to the first pair of devices in such a manner that current changes in the devices in the first pair are linearly related to the resulting current changes in the devices in the second pair over a wide range of signal amplitudes. The relationship between the two pairs of devices is such that the output signal from the second pair of devices is linearly related to the input signal driving the first pair of devices, the nonlinear characteristics of the devices cancelling due to the unique manner of connecting the two pairs of devices.

As a result of the linear relationship of the output signal to the input signal, harmonic distortion and intermodulation of the output signal are minimized. For example, harmonic distortion in a typical embodiment is usually down at least 30 db from the fundamental. Additionally, in one embodiment of this invention the linearity of the circuit caused intermodulation products from two equal-amplitude input signals separated by 50KHz at both 500 KHz and 30 MHz center frequencies to be at least 50 db down from from either input signal. Significantly, the pairing of transistors and/or diodes as required by this invention is particularly suitable for producing an integrated circuit version of this invention.

Other characteristics and advantages of this invention will become apparent from the following detailed description of selected embodiments of the invention.

DETAILED DESCRIPTION

Figure 1:
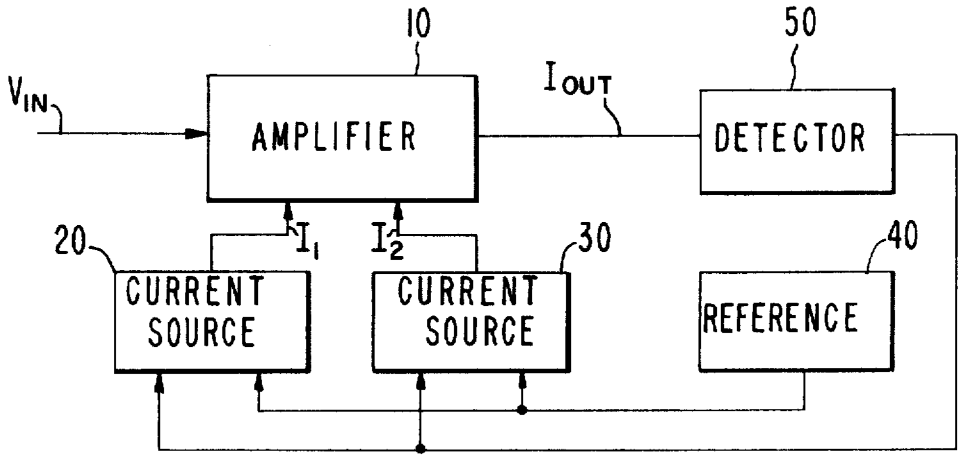
FIG. 1 shows schematically the basic system of this invention.

FIG. 1 shows schematically the circuit of this invention. An input signal, represented by voltage $V_{in}$, is operated upon in amplifier 10 and passed to detector 50, which produces a DC signal with an amplitude proportional to the average amplitude of the output signal from amplifier 10. Detector 50 comprises in its simplest embodiment, a rectifier and a low pass filter. The output signal from detector 50 is, in turn, fed back and used to control the magnitudes of the currents from current sources 20 and 30. Current source 20 supplies a current $I_1$ to amplifier 10 while current source 30 supplies a current $I_2$ to amplifier 10. Amplifier 10 is arranged so that its transconductance $I_{out}/V_{in}$ is a function solely of the ratio $I_2/I_1$ for given load resistors in amplifier 10. Thus, so long as the ratio of currents $I_2/I_1$ remains constant and independent of temperature, the gain of amplifier 10 will likewise remain constant, independent of temperature.

During the operation of amplifier 10, which might for example, be a video amplifier, the amplitude of $V_{in}$ will frequently vary. However, it is usually desired to maintain constant the amplitude of the output signal from amplifier 10. To do this, the ratio $I_2/I_1$ of currents from current sources 20 and 30 must be appropriately varied to adjust the gain of amplifier 10 in the proper direction. Current sources 20 and 30 are thus controlled to hold the amplitude of the output signal from detector 50 to a desired relationship to the amplitude of the output signal from reference source 40.

Figure 2:
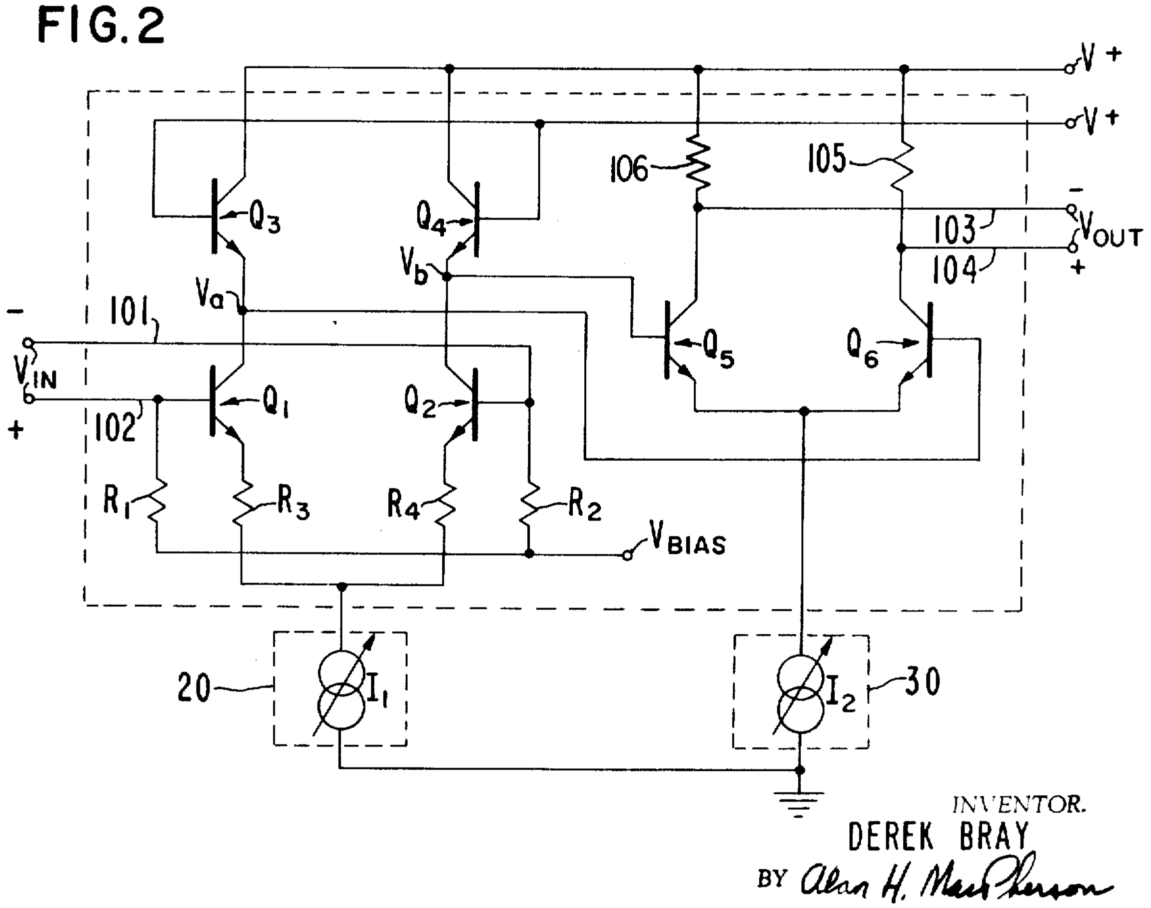
FIG. 2 shows in more detail the circuitry of selected ones of the components shown in FIG. 1.
Figure 3:
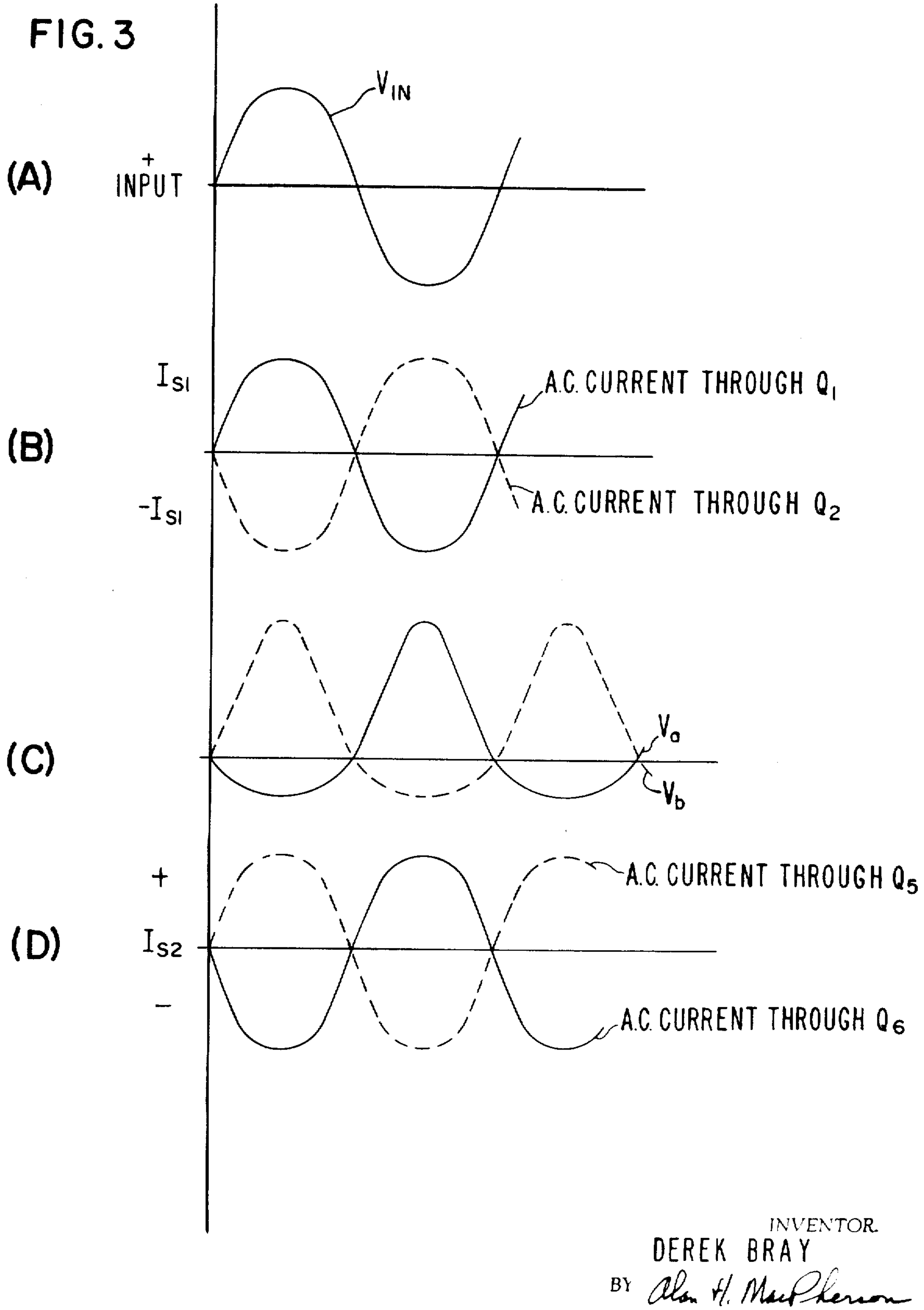
FIGS. 3*a* through 3*d* show the signals generated at various points throughout the circuit of FIG. 2.

FIG. 2 shows in more detail the circuit of amplifier 10 together with current sources 20 and 30. An input signal $V_{in}$ is applied to leads 101 and 102. If $V_{in}$ (for illustration purposes assumed to be a sinusoid initially increasingly positive with time as shown in FIG. 3*a*) is applied across leads 102 and 101 connected to the bases of transistors Q1 and Q2 respectively, Q1 is driven positive and conducts an increasingly larger A.C. current $I_{s1}$, as shown in FIG. 3*b*. On the other hand, lead 101, connected to the base of transistor Q2, is initially driven negative relative to lead 102 by $V_{in}$. Thus the current through Q2 decreases by the amount $I_{s1}$.

Current source 20 draws a constant current $I_1$. Initially the current $I_1$ divides equally between Q1 and Q2 as a result of R3 and R4 being substantially equal. To maintain the total current supplied to current source 20 constant, an increase in current supplied by transistor Q1 must be matched by a decrease in current supplied by transistor Q2.

The currents drawn by transistors Q1 and Q2 pass through transistors Q3 and Q4 respectively, connected as diodes. A current increase through Q3 is matched by an equal current decrease through Q4.

The voltage V across the emitter-base junction of a transistor increases logarithmically with the current I across this junction according to the well-known relationship $$I=I_0[e^{qV/kT}-1], \qquad 1.$$

or equivalently

8. $V=[kT/q]\ln[1+I/I_o]$ where $I_o$ is some initial current, 8.

$q$ is the electronic charge, $k$ is Boltzmann's constant, and $T$ is absolute temperature.

As the voltage across the emitter-base junction of transistor Q3 increases because of the increase in the current drawn by transistor Q1 across this junction, the voltage across the emitter-base junction of transistor Q4 decreases because of the decrease in the current drawn by transistor Q2 across Q4's emitter-base junction. Because, of the nonlinear relationship between current and voltage given by Equation (1), these two voltage changes across the emitter-base junctions of transistors Q3 and Q4 are not equal in magnitude. Rather, the voltage changes across Q3 and Q4 are very much dependent upon the direction in which the current changes as well as upon the magnitude of the current change. Thus, as shown in FIG. 3c, the voltage $V_a$ on the emitter of transistor Q3 and the collector of transistor Q1 varies in a highly nonlinear fashion, and is substantially 180° out of phase with the voltage $V_b$ on the emitter of transistor Q4 and the collector of transistor Q2.

Now, the voltage $V_b$ drives the base of transistor Q5, while the voltage $V_a$ drives the base of transistor Q6. As the voltage $V_a$ drops with an increase in current through transistor Q3, transistor Q6 is driven to conduct less current. Thus the voltage on the collector of Q6 increases. On the other hand, at the same instant, the voltage $V_b$ is increasing. This drives transistor Q5 to conduct more current, thereby decreasing the voltage on its collector 103. Because of the cancelling effects of the logarithmic characteristics of Q3 and Q6, and Q4 and Q5, the output signal on leads 103 and 104 is linearly related to the input signal on leads 101 and 102.

Transistors Q5 and Q6 are connected to current source 30. Because current source 30 draws the constant current $I_2$, an increase in the current drawn by this source through transistor Q5 is matched by a decrease in the current drawn by this source through transistor Q6.

An analysis of the circuit of FIG. 2 shows that the A.C. signal current $I_{s1}$ in transistor Q1 is given by $$I_{s1} = V_{in}/(R3 + R4) \qquad 2.$$

Likewise, the A.C. signal current in transistor Q2 is given by $$-I_{s1} = -V_{in}/(R3+R4) \qquad 3.$$

The D.C. current through each of transistors Q1, Q2, Q3 and Q4 equals $I_1/2$. The D.C. current through each of transistors Q5 and Q6 equals $I_2/2$. If the A.C. signal current in Q6 equals $-I_{s2}$ and the AC signal current in Q5 equals $+I_{s2}$, then taking equation 1 above, and assuming $e^{qV/kT}$ is much greater than unity, we can write for Q3

$$I_1/2+I_{s1} = I_o e^{q(V_s-V_a)/kT}$$

where $V_s$ equals the base voltage on Q3 (and on Q4) and $V_a$ equals Q3's steady state emitter voltage $\overline{V}$ plus the AC signal voltage on Q3's emitter, $(-v_a)$. Thus $$I_1/2+ I_{s1} = (I_1/2)e^{qv_a/kT} \qquad 4.$$

We can also write for Q4

$$I_1/2-I_{s1} = I_o e^{q(V_s-V_b)/kT}$$

where $V_s$ equals the base voltage on Q4 (and on Q3) and $V_b$ equals Q4's steady state emitter voltage $\overline{V}$ plus the A.C. signal voltage on Q4's emitter $(v_b)$. Thus $$I_1/2 -I_{s1} = (I_1/2)e^{-qv_b/kT} \qquad 5.$$

Similarly, for Q5 and Q6 we get respectively $$I_2/2 + I_{s2} = I_0 e^{q(V_b-V_s)/kT}$$

$$= (I_2/2)e^{qv_b/kT} \qquad 6.$$

$$I_2/2 - I_{s2} = I_0 e^{q(V_a-V_s)/kT}$$

$$= (I_2/2)e^{-qv_a/kT} \qquad 7.$$

Combining equations (4) and (5) we get $$(I_1+2 I_{s1})/(I_1-2I_{s1}) = e^{qv_a/kT}e^{-qv_b/kT}$$

Likewise, combining equations (6) and (7) we get $$(I_1+2 I_{s1})/(I_1-2I_{s1}) = e^{qv_a/kT}e^{-qv_b/kT}$$

By combining equations (8), (9) and (2), we find that the AC output current $I_{s2}$ is related to the input voltage $V_{in}$ by the following relationship $$I_{s2}/V_{in} = I_2/I_1\,(R3 + R4). \qquad 10.$$

It should be noted that $I_{s2}$ has been defined as positive when decreasing the emitter current through Q6. If $I_{s2}$ is considered as positive when increasing the emitter current through Q6, then a minus sign should precede the term on the right hand side of equation (10).

Equation (10) shows that the ratio of the output current $I_{s2}$ to the input voltage $V_{in}$ is given by the ratio of currents $I_2/I_1$ from current sources 30 and 20 divided by the sum of R3 and R4, the emitter resistors of transistors Q1 and Q2 respectively. Therefore, the transconductance of the circuit shown in FIG. 2 is independent of all effects except those which affect the current sources $I_2$ and $I_1$. As shown by the fact that the logarithmic terms cancel from equation (10), the logarithmic characteristics of transistors Q3, Q4, Q5 and Q6 have no effect upon the output gain of the circuit provided these transistors are always forward biased. Likewise, temperature changes and environmental changes have no effect on the output gain of the circuit provided R3 and R4 do not vary with temperature and provided the ratio $I_2/I_1$ is independent of temperature. In a properly designed circuit, such as shown in FIG. 4, $I_2/I_1$ is substantially constant over a wide range of temperature variations.

Figure 4:
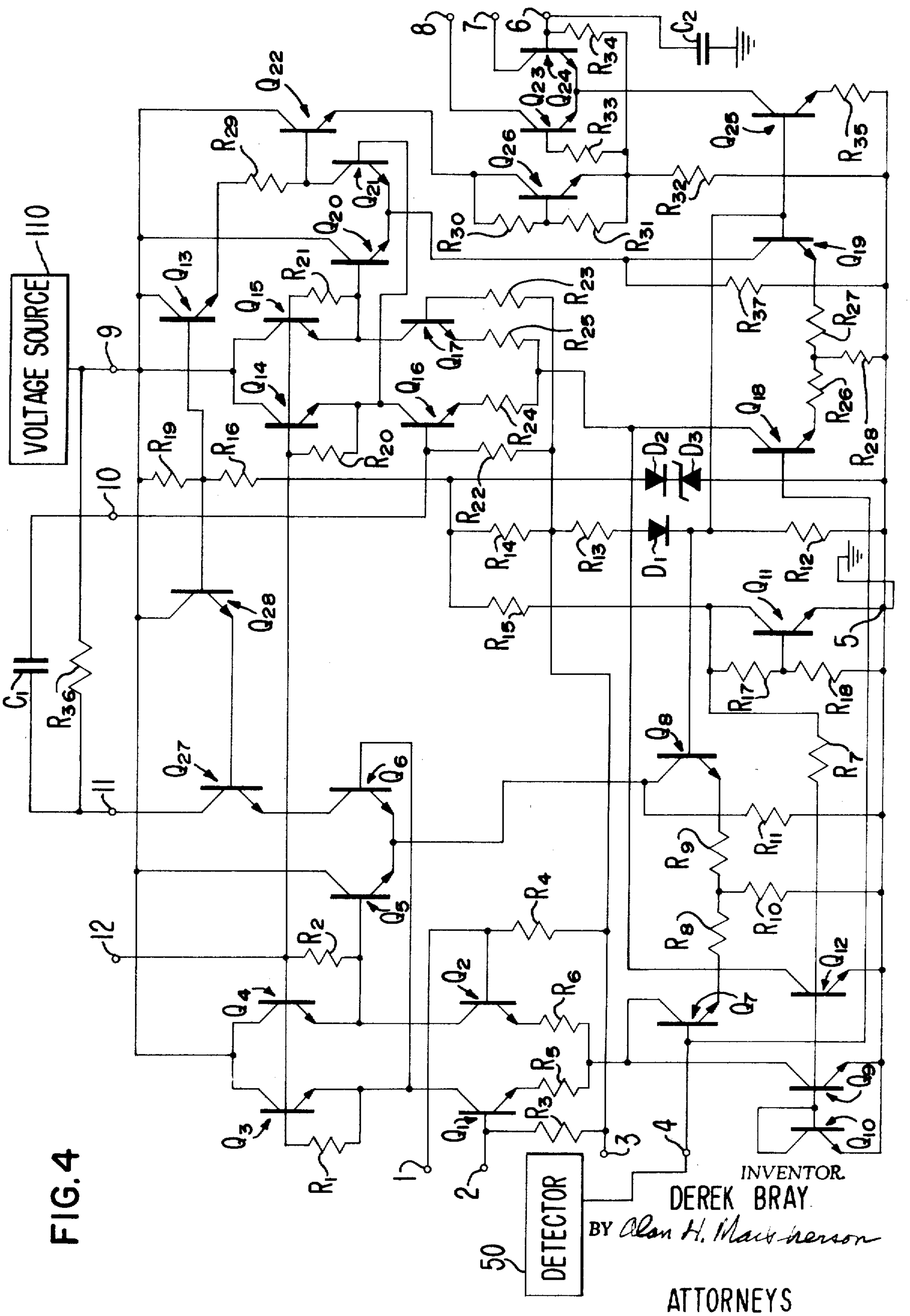
FIG. 4 is a circuit diagram of a typical circuit using the principles of this invention.

FIG. 4 shows the diagram of a circuit built using the principles of this invention. The circuit shown in FIG. 4 contains two automatic gain control stages of the type shown in FIG. 2. The first stage, driven by an input signal $V_{in}$ on leads 1 and 2, includes transistors Q1 and Q2, connected as a differential amplifier, a first pair of semiconductor devices —transistors Q3 and Q4—driven by a signal from the differential amplifier, and a second pair of semiconductor devices—transistors Q5 and Q6 —coupled to Q3 and Q4 according to the principles of this invention to cancel out device nonlinearities.

A current source, consisting of transistors Q7 and Q9 draws a total current $I_1$ through transistors Q1 and Q2, their emitter resistors R5 and R6, and transistors Q3 and Q4.

As discussed earlier, in the absence of an input signal on leads 1 and 2, half this current passes through transistors Q1 and Q3 and resistor R5 while the other half of this current passes through transistors Q2 and Q4 and resistor R6. Transistor Q9 is forward biased by transistor Q10 connected as a diode across Q9's base and emitter leads. Transistor Q7 is connected to input lead 4 which in turn is connected to detector circuit 50 (FIG. 1). When the voltage on lead 4 increases due to an increase in the average amplitude of the rectified output signal from amplifier 10 (FIG. 1), transistor Q7 draws more bias current $I_1$ through transistors Q1, Q2, Q3 and Q4. The emitter current through transistor Q7 thus changes, changing the voltage drop across resistor R10 which is part of a resistive network including resistors R8 and R9. An increase in voltage across resistor R10 increases the emitter voltage on transistor Q8, and thus decreases the bias current $I_2$ drawn by transistor Q8 and resistor R11 through the output pair of transistors Q5 and Q6 in the first automatic gain-control stage.

The base voltage on Q8 is a reference voltage supplied from voltage source 110 through the resistive network including resistors R12, R13, R14, R16 and R19, diodes D1 and D2 and zener diode D3. Diodes D1 and D2, together with transistor Q10 connected as a diode across the base-emitter junction of transistor Q9, assist in holding the current ratio $I_2/I_1$ constant despite temperature variations.

The output signal from transistor Q6 is passed through cascode-connected transistor Q27 which acts as an impedance transformer and then through coupling capacitor C1 (external to the integrated circuit version of this invention) to the base of transistor Q16, the input of the second automatic gain-control amplifier. Transistor Q28 serves to hold the base voltage on Q27 at a desired value and supplies to Q27 its base current.

The second automatic gain-control amplifier is substantially identical to the first. It includes a differential amplifier consisting of transistors Q16 and Q17 connected to a first pair of semiconductor devices, transistors Q14 and Q15. Transistors Q14 and Q15 are connected to a second pair of semiconductor devices, transistors Q20 and Q21, in such a manner as to cancel the non-linearities of the two pairs of devices. The input to this second AGC circuit is the base of Q16. The output, which is the collector voltage on Q21 developed across load resistor R29 by the emitter current of Q13, drives transistor Q22, connected as an emitter follower. The current through Q22 passes through a voltage divider network including transistor Q26, together with resistor R30 coupling the collector of Q26 to its base, resistor R31 coupling the base of Q26 to its emitter, and resistor R32. Q26 effectively acts as a high impedance to D.C. current but as a low impedance to A.C. current, thus efficiently coupling the A.C. signal from Q22 through to the output of the circuit while selectively reducing the DC bias voltage at the output of the circuit. Load resistor R32 connected to the emitter of Q26 has as produced across it an output voltage which drives the bases of transistors Q23 and Q24, connected to form a differential amplifier. Circuit output leads 7 and 8 are connected to the collectors of Q24 and Q23 respectively. However, the base of transistor Q24, which is connected to lead 6 of the integrated circuit version of this amplifier, is capacitively coupled to ground by capacitor C2 which forms an RF short circuit at the desired operating frequency of the circuit. Transistor Q25, the base of which is driven by the reference voltage generated across resistor R12 (which likewise drives the base of Q8) acts as a constant current source drawing bias current through Q23 and Q24.

Two current sources likewise bias the second AGC amplifier. The first current source, consisting of transistor Q18 together with resistor R26 and R28, and transistor Q12, draws the current $I_3$ through the transistors Q16 and Q17, their emitter resistors R24 and R25, and transistors Q14 and Q15. The second current source, consisting of transistor Q19 together with resistors R37, R27 and R28, draws the current $I_4$ through transistors Q20 and Q21.

An increase in the amplitude of the output signal from this two-stage AGC amplifier increases the level of the D.C. output signal from detector 50 (FIG. 1). This DC output signal is fed back to pin 4 of the integrated circuit version of FIG. 4. Pin 4 is connected both to the base of transistor Q7 in the first current source of the first AGC amplifier and to the base of transistor Q18 in the first current source in the second AGC amplifier. An increase in the level of this DC signal increases the current drawn by transistors Q7 and Q18. This increase in current increases the emitter voltages on transistors Q8 and Q19. Because the base voltage on Q8 and Q19 is held constant by the voltage across resistor R12, transistors Q8 and Q19 conduct proportionately less current. As a result, the ratios of currents $I_2/I_1$ and $I_4/I_3$ from the four current sources associated with the two AGC stages drop. This lowers the gain of the two AGC stages in accordance with equation (10), and thus the amplitude of the output signal from detector 50 (FIG. 1). This process continues until the amplitude of the output signal from detector 50 again assumes its desired level.

Likewise, when the amplitude of the output signal from detector 50 drops beneath its desired value, the ratios $I_2/I_1$ and $I_4/I_3$ associated with the two AGC amplifier stages increase, thereby increasing the amplitude of the output signal from detector 50 to its desired value. Changing R12 varies the reference voltage on the bases of transistors Q8 and Q19 and thus changes the nominal gain of the two stage AGC amplification circuit shown in FIG. 4.

In one embodiment, the resistive and capacitive elements of the circuit of FIG. 4 were given the following values. (Resistor R1 and capacitors C1 and C2 are external to the integrated circuit version of FIG. 4.)

| | | | | | | | |
|---|---|---|---|---|---|---|---|
| R1 | 5.2K | R11 | 13K | R21 | 5.2K | R31 | 2.6K |
| R2 | 5.2K | R12 | 2.6K | R22 | 5K | R32 | 3.9K |
| R3 | 5K | R13 | 3.5K | R23 | 5K | R33 | 650 |
| R4 | 5K | R14 | 2.6K | R24 | 310 | R34 | 650 |
| R5 | 310 | R15 | 2K | R25 | 310 | R35 | 285 |
| R6 | 310 | R16 | 880 | R26 | 190 | R36 | 1K |
| R7 | 5.2K | R17 | 11.7K | R27 | 190 | R37 | 6.6K |
| R8 | 190 | R18 | 2.6K | R28 | 360 | C1 | 0.1$\mu$f |
| R9 | 190 | R19 | 880 | R29 | 1.3K | (Bypass at RF frequency) | |
| R10 | 390 | R20 | 5.2K | R30 | 8K | C2 | 0.1$\mu$f |
| | | | | | | (Bypass at RF frequency) | |

The transistors and diodes in this circuit are formed on a single wafer of silicon, using well-known planar double diffusion techniques. The resistors are also formed in the silicon wafer using planar techniques. One such technique is described in copending patent application Ser. No. 717,757, filed by Harold S. Crafts, entitled "Planar Epitaxial Resistors" and assigned to Fairchild Camera and Instrument Corp., the assignee of this application. Alternatively, these resistors can be deposited on insulation overlying the surface of the wafer. Diodes D1 and D2 are formed from base-collector junctions while zener diode D3 is formed from a base-emitter junction on this wafer.

A typical AGC stage constructed from discrete components in accordance with this invention had a voltage gain of 72 db at 500 KHz. This gain dropped to 46 db at 30 MHz. Harmonic distortion was found to be at least 30 db down from the fundamental over a wide range of frequencies varying from 500 KHz to 10 MHz. Intermodulation between two equal amplitude input signals separated by 50 KHz at center frequencies of 500 KHz and 30 MHz was down at least 50 db from each input signal. And the AGC control voltage range was 80 db.

Other embodiments of this invention, such as amplifiers using a plurality of AGC stages constructed according to the principles of this invention, will be obvious in view of this disclosure. In addition, control of the gain of each AGC stage independently of the gain of the other AGC stages is possible.

What is claimed is:

1. An automatic gain control circuit comprising:

means for amplifying an input signal to produce a first output signal;

means for comparing said first output signal to a reference signal and for producing a difference signal proportional to the difference between said first output signal and said reference signal; and first and second current sources, the amplitudes of the currents drawn by said sources being controlled by said difference signal, said first and second current sources being coupled to said means for amplifying so that the currents from said first and second current sources control the gain of said means for amplifying such that said difference signal is driven to approximately zero amplitude;

said means for amplifying comprising:

a differential amplifier, the bias current through said differential amplifier being the current drawn by said first current source;

a first pair of semiconductor devices selectively coupled to said differential amplifier and biased by the current drawn by said first current source, the current through the first device in said first pair increasing in response to a positive input signal to said differential amplifier while the current through the second device in said first pair decreases an equal amount in response to said positive input signal; and a second pair of semiconductor devices, each device in said second pair being selectively coupled to a corresponding device in said first pair of devices so that when the current through a selected one of said first pair of devices changes in one direction, the current through the corresponding device in said second pair of devices changes in the opposite direction in such a manner that the output signal from said second pair of devices is linearly related to the input signal to said differential amplifier, the bias current through said second pair of devices being the current drawn by said second current source.

2. Structure as in claim 1 in which said differential amplifier comprises:

a first transistor the base of which serves as the first input lead to said differential amplifier, the emitter of which is connected through a first load resistor to said first current source, and the collector of which is connected to said first device in said first pair of semiconductor devices;

a second transistor, the base of which serves as a second input lead to said differential amplifier, the emitter of which is connected through a second load resistor to said first current source, and the collector of which is connected to said second device in said first pair of semiconductor devices;

said first and second transistors being connected in such a manner that a positive input voltage on said first input lead relative to said second input lead increases the current drawn through the first transistor and simultaneously decreases by an equal amount the current drawn through the second transistor, thereby changing in the same manner the current drawn through the corresponding devices in said first pair of semiconductor devices.

3. Structure as in claim 2 in which said first pair of semiconductor devices comprises:

a third transistor the emitter of which is connected to the collector of the first transistor in said differential amplifier, the base of which is connected to a first supply voltage and the collector of which is connected to a second supply voltage; and a fourth transistor, the emitter of which is connected to the collector of the second transistor in said differential amplifier, the base of which is connected to said first supply voltage and the collector of which is connected to said second supply voltage;

said third and fourth transistors being connected to said first and second transistors in said differential amplifier in such a manner that an increase in the collector current drawn by said first transistor and a corresponding decrease in the collector current drawn by said second transistor results in a corresponding emitter current increase in said third transistor and a corresponding emitter current decrease in said fourth transistor.

4. Structure as in claim 3, in which said second pair of semiconductor devices comprises:

a fifth transistor the emitter of which is connected to said second current source, the base of which is connected to the emitter of said fourth transistor in said first pair of semiconductor devices and the collector of which is connected both to said second voltage source and to a first output lead from said automatic gain control circuit; and a sixth transistor the emitter of which is also connected to said second current source, the base of which is connected to the emitter of said third transistor, and the collector of which is connected both to a selected voltage source through a load resistor and to a second output lead from said automatic gain control circuit.

5. Structure as in claim 4 in which the collector of said fifth transistor is connected to said second voltage source through a load resistor.

6. An amplifier circuit comprising:

a first current source drawing the current $I_1$;

a second current source drawing the current $I_2$;

a differential amplifier connected to said first current source so that the bias current through said differential amplifier equals the current $I_1$ drawn by said first current source, said differential amplifier comprising first and second amplifying means connected to the input leads to said amplifier circuit in such a manner that a voltage of one polarity across said input leads causes the current through said first and second amplifying means to change equally in opposite directions;

a first pair of semiconductor devices, the first and second devices in said first pair being coupled to said first and second amplifying means respectively and drawing the bias current $I_1$, said first and second devices in said first pair comprising diodes;

a second pair of semiconductor devices, the first and second devices in said second pair each being selectively coupled to a corresponding one of the devices in said first pair so that a current change in a device in the first pair results in a linearly related current change not necessarily of the same amplitude in the corresponding coupled device in said second pair such that the changes in currents through the devices in said second pair are linearly related to the voltage across the input leads to said first and second amplifying means, said second pair of devices being connected to said second current source and drawing the total bias current $I_2$.

7. Structure as in claim 6 in which said first and second devices in said first pair comprise first and second transistors connected as diodes.

8. Structure as in claim 7 in which said first and second devices in said second pair of semiconductor devices are third and fourth transistors.

9. An N stage amplifier, where N is a selected positive integer, wherein each stage comprises:

a first pair of semiconductor devices;

a differential amplifier selectively coupled to said first pair of semiconductor devices for passing an input signal to said first pair of devices, a second pair of semiconductor devices, each device in said second pair being connected to a corresponding device in said first pair so that the effect on a signal of nonlinearities in said two connected devices cancel out;

a first current source for biasing said differential amplifier and said first pair of devices;

a second current source for biasing said second pair of devices; and means for varying the currents produced by said first and second sources thereby to vary the gain of said stage.

10. An automatic gain control circuit comprising:

current source means for drawing a first current $I_1$;

current source means for drawing a second current $I_2$;

a differential amplifier, the bias current through said differential amplifier being $I_1$, a first pair of semiconductor devices directly coupled to said differential amplifier and biased by the current $I_1$, the current through the first device in said first pair increasing in response to a positive input signal to said differential amplifier while the current through the second device in said first pair decreases an equal amount in response to said positive input signal;

a second pair of semiconductor devices biased by the current $I_2$, each device in said second pair being directly coupled to a corresponding device in said first pair such that a current of $I_{s2}$ in one of said second pair of semiconductor devices is related to a current change $I_{s1}$ in a first pair of semiconductor devices by the equation $I_{s1}/I_{s2} = I_1/I_2$;

said differential amplifier comprising:

a first transistor the base of which serves as the first input lead to said differential amplifier, the emitter of which is connected through a first load resistor R3 to said means for drawing a first current, and the collector of which is connected to said first device of said first pair of semiconductor devices; and a second transistor, the base of which serves as a second input lead to said differential amplifier, the emitter of which is connected through a second load resistor R4 to said means for drawing a first current, and the collector of which is connected to said second device in said first pair of semiconductor devices; and wherein said current change $I_{s2}$ in a device in said second pair of semiconductor devices is related to the input voltage $V_{in}$ to said differential amplifier by the equation $I_{s2}/V_{in} = I_2/I_1\,(R3+R4)$.

* * * * *